United States Patent
Baum et al.

(10) Patent No.: US 6,399,208 B1
(45) Date of Patent: Jun. 4, 2002

(54) SOURCE REAGENT COMPOSITION AND METHOD FOR CHEMICAL VAPOR DEPOSITION FORMATION OR ZR/HF SILICATE GATE DIELECTRIC THIN FILMS

(75) Inventors: Thomas H. Baum; Witold Paw, both of New Fairfield, CT (US)

(73) Assignee: Advanced Technology Materials Inc., Danbury, CT (US)

( * ) Notice: Subject to any disclaimer, the term of this patent is extended or adjusted under 35 U.S.C. 154(b) by 0 days.

(21) Appl. No.: 09/414,133

(22) Filed: Oct. 7, 1999

(51) Int. Cl.[7] .............................. B32B 9/00; C07F 7/00; C23C 16/00
(52) U.S. Cl. ...................... 428/446; 428/470; 428/689; 427/255.28; 427/255.6; 106/1.12; 106/1.22; 106/287.13; 106/287.14; 106/287.16
(58) Field of Search .................................. 428/446, 470, 428/689; 106/1.12, 1.22, 286.4, 287.13, 287.16, 287.14; 427/487, 489, 497, 503, 585, 255.37, 255.28, 255.6

(56) References Cited

U.S. PATENT DOCUMENTS

| | | | |
|---|---|---|---|
| 3,959,459 A | | 5/1976 | Curry ........................... 424/66 |
| 3,969,386 A | * | 7/1976 | Ballard et al. ........... 260/429 R |
| 4,018,707 A | * | 4/1977 | Wyatt ........................... 252/430 |
| 4,122,109 A | | 10/1978 | Halm ........................... 556/456 |
| 5,104,690 A | | 4/1992 | Greenwald ................. 427/126.3 |
| 5,204,314 A | | 4/1993 | Kirlin et al. ................. 505/447 |
| 5,225,561 A | | 7/1993 | Kirlin et al. ................. 546/256 |
| 5,280,012 A | | 1/1994 | Kirlin et al. ................. 505/447 |
| 5,401,305 A | * | 3/1995 | Russo et al. ................. 106/287.1 |
| 5,453,494 A | | 9/1995 | Kirlin et al. ................. 534/15 |
| 5,454,861 A | | 10/1995 | Hasegawa et al. ............. 106/2 |
| 5,536,323 A | | 7/1996 | Kirlin et al. ................. 118/726 |
| 5,635,250 A | | 6/1997 | Blum et al. .................. 427/387 |
| 5,688,979 A | | 11/1997 | Lee et al. ..................... 556/56 |
| 5,820,664 A | | 10/1998 | Gardiner et al. ........ 106/287.17 |
| 5,876,503 A | * | 3/1999 | Roeder et al. ............... 118/715 |
| 5,919,522 A | | 7/1999 | Baum et al. ............. 427/248.1 |
| 6,110,529 A | | 8/2000 | Gardiner et al. ............ 427/250 |

FOREIGN PATENT DOCUMENTS

JP 401122982 A * 5/1989

OTHER PUBLICATIONS

U.S. application No. 07/927,134, Zhang, filed Aug. 7, 1992.
U.S. application No. 07/615,303, Brown et al., filed Nov. 19, 1990.
U.S. application No. 07/549,389, Kirlin et al.
D.C. Bradley and I.M. Thomas, "A new method for the preparation of trialkylsiloxy-derivatives of metals", Chem & Ind (London) 1958, 1231-2.

(List continued on next page.)

*Primary Examiner*—Deborah Jones
*Assistant Examiner*—Stephen Stein
(74) *Attorney, Agent, or Firm*—Oliver A. Zitzmann; Margaret Chappuis; Steven J. Hultquist

(57) ABSTRACT

A precursor composition for forming a zirconium and/or hafnium silicate film on a substrate, e.g., by chemical vapor deposition (CVD). Illustrative precursor compositions include (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the M/Si ratio in the deposited silicate thin film. The precursor composition may contain a solvent medium, so that the composition is adapted for liquid delivery CVD, to form stable thin-film gate dielectrics for fabrication of microelectronic devices.

71 Claims, 5 Drawing Sheets

OTHER PUBLICATIONS

C.G. Barraclough, D.C. Bradley, J. Lewis, and I.M. Thomas, "The infrared spectra of some metal alkoxides, trialkyl-silyloxides, and related silanols", J. Chem. Soc. 1961, 2601–5.

D.C. Bradley and I.M. Thomas, "Trialkylsiloxy–derivatives of transition metals", Chem & Ind (London) 1958, 17.

D.C. Hrncir, "Preparation of heterosiloxanes containing Zr and Hf and their uses as precursors to refractory metals", J. Mater. Res., vol. 3(3), May/Jun. 1988, pp. 410–412.

D.C. Bradley and I.M. Thomas, "Organosilyloxy–derivatives of metals. Part I. Alkylsilyloxy–derivatives of titanium, zirconium, niobium, and tantalum", J. Chem. Soc., 1959, pp. 3404–3411.

* cited by examiner

SOURCE REAGENT COMPOSITION AND METHOD FOR CHEMICAL VAPOR DEPOSITION FORMATION OR ZR/HF SILICATE GATE DIELECTRIC THIN FILMS

BACKGROUND OF THE INVENTION

1. Field of the Invention

The present invention relates to a source reagent composition and method for the formation of Zr/Hf silicate thin film gate dielectric structures for microelectronic devices.

2. Description of the Related Art

The formation of stable gate dielectric thin films is an increasingly important focus of microelectronic device research and development efforts.

Zirconium silicate ($ZrSiO_4$) and hafnium silicate ($HfSiO_4$) are potentially useful materials for such gate dielectric thin films on silicon substrates. The source reagents and methodology employed to form such gate dielectric thin films are extremely critical for the provision of a gate structure having satisfactory characteristics in the product device. Specifically, the source reagents and methodology must permit the gate dielectric thin film to form on a clean silicon surface, without the occurrence of side reactions producing predominantly silicon dioxide ($SiO_2$), locally doped $SiO_2$ and/or other surface impurities that lower the dielectric constant and compromise the performance of the product microelectronic device.

SUMMARY OF THE INVENTION

The present invention relates in one aspect to a precursor composition for forming a metal silicate thin-film dielectric on a substrate, such precursor composition including a source reagent selected from the group consisting of:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof;

(c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the desired M/Si ratio in the deposited silicate thin film;

(d) a precursor mixture comprising (1) a first precursor metal compound or complex including a metal M, wherein M=Zr or Hf and (2) a second precursor silicon compound or complex not containing such metal M, wherein the relative proportions of the first and second precursors relative to one another are employed to controllably establish the desired $M_x/Si_{1-x}$ ratio in the deposited silicate thin film, wherein x is from about 0.01 to 0.99;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired $M_x/Si_{1-x}$ ratio in the deposited silicate thin film, wherein x is from about 0.01 to 0.99;

(f) a precursor metal compound or complex including a metal M, wherein M=Zr or Hf, at least one alcoxide ligand and at least one β-diketonate ligand, such precursor metal compound or complex optionally further containing silicon;

(g) the precursor metal compound or complex (d) wherein the second precursor silicon compound or complex not containing such metal M is a gas at STP, e.g. silane, and the relative proportions of the first and second precursors relative to one another are employed to controllably establish the desired $M_x/Si_{1-x}$ ratio in the deposited silicate thin film, wherein x is from about 0.01 to 0.99;

(h) a precursor metal compound or complex including a metal M, wherein M=Zr or Hf, at least one alcoxide ligand and at least one β-diketonate ligand, such precursor metal compound or complex optionally further containing silicon;

(i) the precursor metal compound or complex (e) not containing silicon, in combination with a second silicon-containing precursor compound or complex;

(j) the precursor metal compound or complex (e) further containing silicon, in combination with a second non-silicon-containing precursor metal compound or complex including a metal M, wherein M=Zr or Hf; and (k) compatible mixtures of any two or more of the foregoing species (a)–(i).

The precursor composition may further comprise a solvent medium, e.g., a solvent selected from the group consisting of ethers, glymes, tetraglymes, amines, polyamines, alcohols, glycols, aliphatic hydrocarbon solvents, aromatic hydrocarbon solvents, cyclic ethers (e.g., tetrahydrofuran, etc.), and compatible combinations of two or more of the foregoing.

Another aspect of the invention relates to a method of forming a metal silicate gate dielectric film on a substrate, comprising vaporizing a precursor composition to form a precursor vapor, and contacting the precursor vapor with a substrate at elevated temperature to deposit the metal silicate gate dielectric film on the substrate, wherein the precursor composition includes a source reagent selected from the group consisting of:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof;

(c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf; wherein the relative proportions of the first and second precursors relative to one another are employed to controllably establish the desired M/Si ratio in the deposited silicate thin film;

(d) a precursor mixture comprising (1) a first precursor metal compound or complex including a metal M, wherein M=Zr or Hf and (2) a second precursor silicon compound or complex not containing such metal M, wherein the relative proportions of the first and second precursors relative to one another are employed to controllably establish the desired M/Si ratio in the deposited silicate thin film;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired M/Si ratio in the deposited silicate thin film;

(f) a precursor metal compound or complex including a metal M, wherein M=Zr or Hf, at least one alcoxide ligand and at least one β-diketonate ligand, such precursor metal compound or complex optionally further containing silicon;

(g) the precursor metal compound or complex (d) wherein the second precursor silicon compound or complex not containing such metal M is a gas at STP, e.g. silane, and the relative proportions of the first and second precursors relative to one another are employed to controllably establish the desired $M_x/Si_{1-x}$ ratio in the deposited silicate thin film, wherein x is from about 0.01 to 0.99;

(h) the precursor metal compound or complex (e) not containing silicon, in combination with a second silicon-containing precursor compound or complex;

(i) the precursor metal compound or complex (e) further containing silicon, in combination with a second non-silicon-containing precursor metal compound or complex including a metal M, wherein M=Zr or Hf; and (j) compatible mixtures of any two or more of the foregoing species (a)–(i).

As used herein, the term "thin film" refers to a material layer having a thickness of less than about 100 microns.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
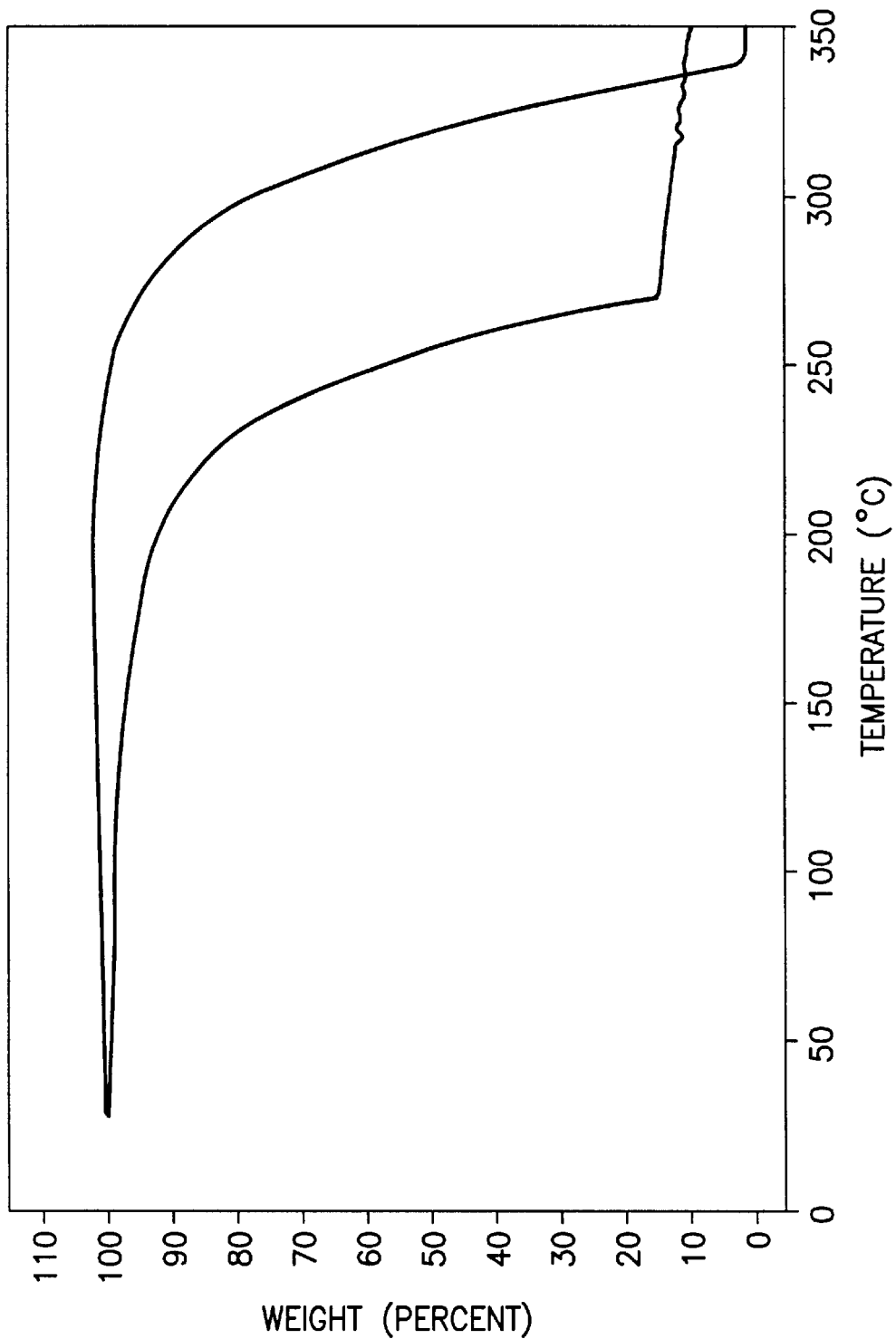
FIG. 1 is a comparative TGA plot of $Zr(O—SiMe_3)_2(thd)_2$ and $Zr(thd)_4$ in argon using a heating rate of 10° C./min.

The disclosures of the following United States patents and patent applications are hereby incorporated herein by reference in their respective entireties:

U.S. patent application Ser. No. 08/835,768 filed Apr. 8, 1997 in the names of Thomas H. Baum, et al.;

U.S. patent application Ser. No. 08/484,654 filed Jun. 7, 1995 in the names of Robin A. Gardiner et al.;

U.S. patent application Ser. No. 08/414,504 filed Mar. 31, 1995 in the names of Robin A. Gardiner et al.;

U.S. application Ser. No. 08/280,143 filed Jul. 25, 1994, in the names of Peter S. Kirlin, et al.;

U.S. patent application Ser. No. 07/927,134, filed Aug. 7, 1992 in the same names;

U.S. patent application Ser. No. 07/807,807, filed Dec. 13, 1991 in the names of Peter S. Kirlin, et al., now issued as U.S. Pat. No. 5,204,314;

U.S. application Ser. No. 08/181,800 filed Jan. 15, 1994 in the names of Peter S. Kirlin, et al., and issued as U.S. Pat. No. 5,453,494;

U.S. application Ser. No. 07/918,141 filed Jul. 22, 1992 in the names of Peter S. Kirlin, et al., and issued Jan. 18, 1994 as U.S. Pat. No. 5,280,012;

U.S. application Ser. No. 07/615,303 filed Nov. 19, 1990;

U.S. application Ser. No. 07/581,631 filed Sep. 12, 1990 in the names of Peter S. Kirlin, et al., and issued Jul. 6, 1993 as U.S. Pat. No. 5,225,561; and U.S. patent application Ser. No. 07/549,389 filed Jul. 6, 1990 in the names of Peter S. Kirlin, et al.

The above-identified applications and patents variously describe source reagent compositions and their synthesis and formulation, as well as CVD techniques including liquid delivery CVD, and provide background and assistive information with respect to the practice of the present invention.

The present invention relates to a source reagent composition and method for forming zirconium silicate and/or hafnium silicate gate dielectric thin films for semiconductor manufacture.

The source reagent composition of the invention may be variously formulated, as hereinafter more fully described, and include the following:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof;

(c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the desired $M_x/Si_{1-x}$ ratio in the deposited silicate thin film, wherein x is from about 0.01 to 0.99;

(d) a precursor mixture comprising (1) a first precursor metal compound or complex including a metal M, wherein M=Zr or Hf and (2) a second precursor silicon compound or complex not containing such metal M, wherein the relative proportions of the first and second precursors relative to one another are employed to controllably establish the desired $M_x/Si_{1-x}$ ratio in the deposited silicate thin film, wherein x is from about 0.01 to 0.99;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired $M_x/Si_{1-x}$ ratio in the deposited silicate thin film, wherein x is from about 0.01 to 0.99;

(f) a precursor metal compound or complex including a metal M, wherein M=Zr or Hf, at least one alcoxide ligand and at least one β-diketonate ligand, such precursor metal compound or complex optionally further containing silicon;

(g) the precursor metal compound or complex (d) wherein the second precursor silicon compound or complex not containing such metal M is a gas at STP, e.g. silane and the relative proportions of the first and second precursors relative to one another are employed to controllably establish the desired $M_x/S_{1-x}$ ratio in the deposited silicate thin film, wherein x is from about 0.01 to 0.99;

(h) the precursor metal compound or complex (e) not containing silicon, in combination with a second silicon-containing precursor compound or complex;

(i) the precursor metal compound or complex (e) further containing silicon, in combination with a second non-silicon-containing precursor metal compound or complex including a metal M, wherein M=Zr or Hf; and (j) compatible mixtures of any two or more of the foregoing species (a)–(i).

The precursor formulations of the present invention may be employed in an adducted form as suggested by the formulae:

$$M(OR)_2(\beta\text{-diketonate})_2 \cdot L_y;$$

$$[M=O(\beta\text{-diketonate})_2 \cdot L_y]_2$$

and $$M(OR)_4 \cdot L_y$$

wherein each R is independently selected from the group consisting of $C_1$–$C_8$ alkyl and trialkylsilyl whose alkyl substituents are each independently selected from the group consisting of $C_1$–$C_8$ alkyl; L is a Lewis base ligand and y is from about ½ to 8.

Alternatively the precursor formulations of the present invention may be represented by the formula:

$$M(OR-L)_4$$

wherein each R is independently selected from the group consisting of $C_1$–$C_8$ alkyl and trialkylsilyl whose alkyl substituents are each independently selected from the group consisting of $C_1$–$C_8$ alkyl and L may be a Lewis base contained in the ligand species capable of bonding to the metal center.

The precursor formulations of the invention may be employed in liquid delivery CVD to form corresponding metal (Zr and/or Hf) silicate thin films on a substrate or microelectronic device precursor structure as a gate dielectric layer thereon.

In liquid delivery CVD, the source liquid may comprise the source reagent compound or complex per se, if the compound or complex is in the liquid phase at ambient temperature (e.g., room temperature, 25° C.) or other supply temperature from which the source reagent is rapidly heated and vaporized to form precursor vapor for the CVD process. Alternatively, if the source reagent compound or complex is a solid at ambient or the supply temperature, such compound or complex can be dissolved or suspended in a compatible solvent medium therefor to provide a liquid phase composition that can be submitted to the rapid heating and vaporization to form precursor vapor for the CVD process. The precursor vapor resulting from the vaporization then is transported, optionally in combination with a carrier gas (e.g., He, Ar, $H_2$, $O_2$, etc.), to the chemical vapor deposition reactor where the vapor is contacted with a substrate at elevated temperature to deposit material from the vapor phase onto the substrate or semiconductor device precursor structure positioned in the CVD reactor.

Preferred metal silicon alcoxide compounds of the invention include those of the formula:

$$M(OR)_4,$$

wherein
M is Zr or Hf;
each R is independently selected from the group consisting of $C_1$–$C_8$ alkyl and trialkylsilyl whose alkyl substituents are each independently selected from the group consisting of $C_1$–$C_8$ alkyl.

Particularly preferred metal alcoxide β-diketonate compounds of the invention include those of the formulae:

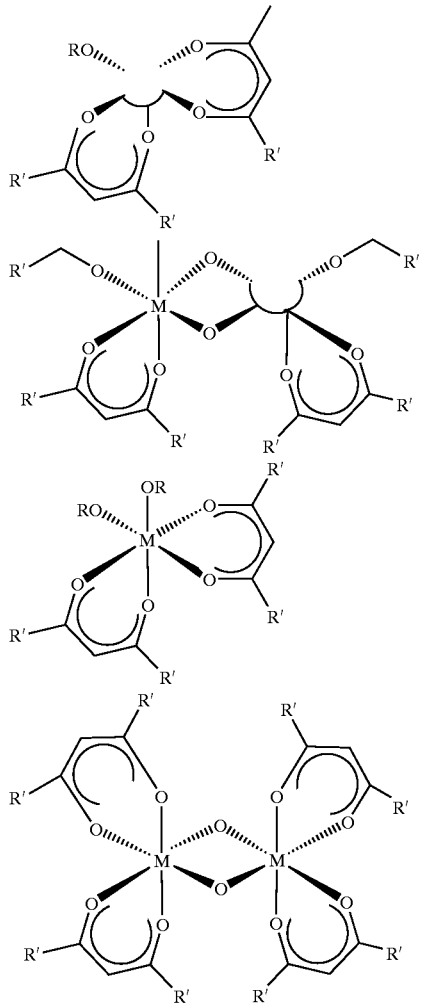

wherein:
M is Zr or Hf;
each R is independently selected from the group consisting of $C_1$–$C_8$ alkyl and trialkylsilyl whose alkyl substituents are each independently selected from the group consisting of $C_1$–$C_8$ alkyl; and
each R' is independently selected from the group consisting of $C_1$–$C_8$ alkyl and $C_1$–$C_8$ haloalkyl.

Thus, the β-diketonate moiety of the above metal precursors may for example comprise
2,4-pentanedione acac;
1,1,1-trifuoro-2,4pentanedionato tfac;
1,1,1,5,5,5-hexafluoro-2,4-pentanedionato hfac;
2,2,6,6-tetratmethyl-3,5-heptanedionato thd;
2,2,7-trimethyl-3,5-octanedionato tod;

6,6,7,7,8,8,8-heptafluoro-2,2-dimethyl-3,5-octanedionato fod; etc.

One particularly preferred metal precursor of the above type has each R=t-butyl or trialkylsilyl, e.g., trimethylsilyl and each R'=t-butyl.

Mixed alcoxide β-diketonate complexes of Zr and/or Hf may be employed, either with or without silicon constituents therein. Examples of silicon-containing complexes of such type include $Zr(OSiMe_3)_2(thd)_2$, $Zr(OSiMe_3)_4$, $Hf(OSiMe_3)_4$, $Hf(OSiMe_3)_2(thd)_2$; these complexes are single source precursors, since the metal, silicon and oxygen components of the desired zirconium silicate film and/or hafnium silicate are derived from such single precursor species.

If such mixed alcoxide β-diketonate complexes do not contain silicon, they may be suitably used in combination with silicon precursor(s) to yield the product metal silicate film. If such mixed alcoxide β-diketonate complexes do contain silicon, they may be suitably used in combination with a non-silicon-containing Zr and/or Hf precursor, to provide a desired metal/silicon ratio in the product dielectric film. For example, an aliphatic alcoxide of hafnium, such as $Hf(OiPr)_2(thd)_2$, may be employed in combination with a second Si-containing precursor, such as a silicon alcoxide (siloxide)-containing precursor, to deposit films of $HfSiO_4$.

By utilizing a precursor composition including two or more source reagent compounds or complexes, with one of the precursors containing at least part of the metal to be incorporated in the product dielectric metal silicate film, and another of the precursors containing at least part of the silicon to be incorporated in the product dielectric metal silicate film, it is possible by selection of the proportions of such respective precursors to correspondingly vary the stoichiometric composition (metal/silicon ratio) of the metal silicate dielectric film, to obtain a desired character of structural and performance electrical properties in the product film. For example, a silicon source reagent, containing no metal, may be used in combination with a metal source reagent, containing no silicon, to control Zr/Si or Hf/Si film ratios.

Alternatively, a first metal- and silicon-containing precursor may be employed in combination with either a metal-containing/silicon-free precursor or a metal-free/silicon-containing precursor, to achieve the desired film characteristics and film stoichiometry.

As mentioned hereinabove, a first metal- and silicon-containing precursor may be employed in combination with a precursor not containing such metal and the metal-free precursor may be a gas at STP, e.g. silane. Combination of such precursors in an oxidizing environment e.g. $O_2$ or $N_2O$, may be used to achieve the desired film characteristics and film stoichiometry.

By way of specific example, $Zr(OSiMe_3)_4$, and $Zr(O-tBu)_4$ may be mixed in a gas stream, e.g., in a carrier gas, or, more preferably, in a single "cocktail" solution in a solvent such as octane, to produce the appropriate stoichiometry in the deposited $ZrSiO_4$ thin-film. In an analogous manner, $Hf(OSiMe_3)_4$, and $Hf(O-tBu)_4$ may be mixed in the gas-phase or more preferably in a single "cocktail" solution, for the deposition of a $HfSiO_4$ thin-film of the desired stoichiometry.

Other compatible aliphatic alcoxides may also be used with equal success in such applications.

The films produced in the broad practice of the invention include stoichiometric metal silicate films, as well as off-stoichiometric (metal-deficient) films. Where the precursor composition includes different source reagents providing respectively differential metal and/or silicon content, then the respective source reagents can be supplied in varied compositions to achieve desired stoichiometric characteristics in the corresponding product metal silicate films. In this manner, the electrical properties, including dielectric constant and leakage, can be controlled and closely tailored to a desired end use, such as a gate dielectric film in an integrated circuit.

Examples of film stoichiometries of the present invention of greatest interest are, for zirconium silicate, $Zr_{0.20}/Si_{0.80}$ and for hafnium silicate, $Hf_{0.05}/Si_{0.95}$.

In the deposition of $ZrSiO_4$ and $HfSiO_4$ thin-films by the use of two individual precursors, wherein one precursor contains silicon and a second precursor contains Zr/Hf, compatible chemistries are desired, thereby allowing mixing of the respective precursors with one another and the achievement of reproducible film growth processes, without deleterious effects such as solution degradation and particle formation.

For example, $Zr(O-tBu)_4$ may be utilized in combination with $Si(O-tBu)_4$, to form stoichiometric ZrSiO4 thin films as gate dielectric materials. These two precursors may be mixed in an organic solvent, single solution as a "cocktail" or they may be introduced from two separate reservoirs and mixed in the gas stream to the CVD reactor. Other alcoxides of Zr/Hf and Si may be similarly employed with equivalent success, provided that the respective alcoxides do not produce undesirable, non-degenerate ligand exchange(s) forming (undesired) new precursor species. It therefore is preferred to use the same alcoxide ligand species, e.g., methoxides, ethoxides, i-propoxides, t-butoxides, trialkylsiloxides, etc. for each of the metal and silicon precursors used in combination with one another.

It is, however, possible to use respective metal and silicon precursors, e.g., alcoxide precursors, regardless of ligand identity and ligand exchange mechanisms, by the use of techniques such as a pulsed CVD method, in which the incompatible precursors are separated both temporally and in the introduction lines to limit particle formation and undesired ligand exchange reactions (chemical reactions).

Metal silicate films can be formed in the broad practice of the present invention by metal alcoxide β-diketonate mixtures in which one of the metal alcoxide β-diketonate precursors contains silicon, and a second of the metal alcoxide β-diketonate precursors does not contain silicon.

For example, a mixture of $Zr(OSiMe_3)_2(thd)_2$, can be used in combination with a silicon-free precursor such as $Zr(alcoxide)_2(thd)_2$, $Zr(thd)_4$, or $[O=Zr(thd)_2]_2$, to deposit a zirconium silicate film, wherein the film stoichiometry is controlled by the relative ratios of the two precursor species. In this manner, a wide range of film compositions can be deposited. Corresponding hafnium precursor approaches may be employed for the formation of hafnium silicate films.

FIG. 1 shows comparative TGA (thermogravimetric) plots of $Zr(O-SiMe_3)_2(thd)_2$ and $Zr(thd)_4$ in argon using a heating rate of 10° C./min. The TGA trace of $Zr(OSiMe_3)_2(thd)_2$ and TGA trace of $Zr(thd)_4$ reveals that these co-reactants have advantageous properties for the controlled growth of ZrSiO4.

Specific illustrative zirconium precursors of the invention include those of the formulae:

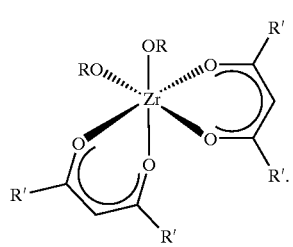

I

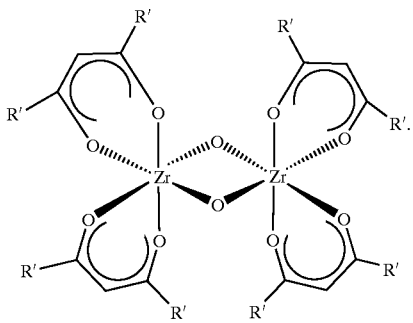

II

In the formula I complex, Zr(OR)$_2$(β-diketonate)$_2$, R may for example be t-butyl or trimethylsilyl and R' may be t-butyl. The β-diketonate in the formula I complex may for example be thd. The precursor may comprise a mixture of complexes of formula I, including a first precursor of such type wherein R is t-butyl, and a second precursor of such type wherein R is trimethylsilyl. A corresponding oxo-linked (—O—) dimer is shown in formula II, which may for example be used in combination with a complex of formula I wherein R is trimethylsilyl, to provide a precursor cocktail of source reagents for forming the zirconium silicate film. The oxo-linked (—O—) dimer may for example be oxo zirconium bis(thd) dimer, [O=Zr(thd)$_2$]$_2$.

Thus, bis alcoxide molecular structures of I can be "tailored" to limit ligand exchange reactions when used in combination with a Zr(OSiMe$_3$)$_2$(β-diketonate)$_2$ precursor in a common solvent medium; alternatively, the bis alcoxide precursor can be delivered in a separate solution using liquid delivery techniques. The zirconium "oxo" bis(diketonate) dimer of formula II can also be used as a Zr source without the introduction of Si content into the deposited film.

Corresponding considerations apply to the following analogous hafnium source reagents:

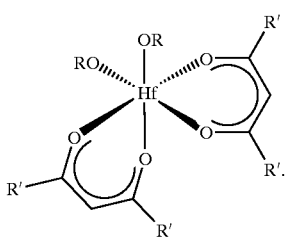

III

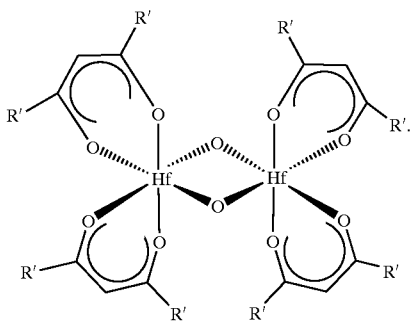

IV

In the foregoing hafnium source reagents of the formulae III and IV, the alkoxy substituent R in formula III may be methyl, ethyl, i-propyl, n-butyl or trimethylsilyl, and the substituent R' in the β-diketonate moiety of formulae III and IV may be alkyl, halo, haloalkyl (e.g., perfluoroalkyl), etc.

wherein the alkyl substituent may be methyl, ethyl, i-propyl, n-butyl, t-butyl, etc.

The source reagents of the invention may be employed in liquid precursor compositions including any suitable solvent media that are compatible with the source reagent(s) used for forming a specific dielectric film. Illustrative of solvent media that may be variously usefully employed are ethers, glymes, tetraglymes, amines, polyamines, alcohols, glycols, aliphatic hydrocarbon solvents, aromatic hydrocarbon solvents, cyclic ethers, and compatible combinations of two or more of the foregoing.

The precursor liquid may be vaporized in any suitable manner and with any suitable vaporization means to form corresponding precursor vapor for contacting with the elevated temperature substrate on which the metal silicate dielectric film is to be formed. The vaporization may for example be carried out with a liquid delivery vaporizer unit of a type as commercially available from Advanced Technology Materials, Inc. (Danbury, Conn.) under the trademark VAPORSOURCE, in which precursor liquid is discharged onto a heated vaporization element, such as a porous sintered metal surface, and flash vaporized. The vaporizer may be arranged to receive a carrier gas such as argon, helium, etc. and an oxygen-containing gas may be introduced as necessary to form the metal silicate film. The precursor vapor thus is flowed to the chemical vapor deposition chamber and contacted with the substrate on which the dielectric film is to be deposited. The substrate is maintained at a suitable elevated temperature during the deposition operation by means of a heating means such as a radiant heating assembly, a susceptor containing a resistance heating element, microwave heat generator, etc. Appropriate process conditions of temperature, pressure, flow rates and concentration (partial pressures) of metal and silicon components are maintained for sufficient time to form the dielectric film at the desired film thickness, e.g., in a range of from about 2 nanometers to about 500 micrometers in thickness, and with appropriate dielectric film characteristics.

Figure 2:
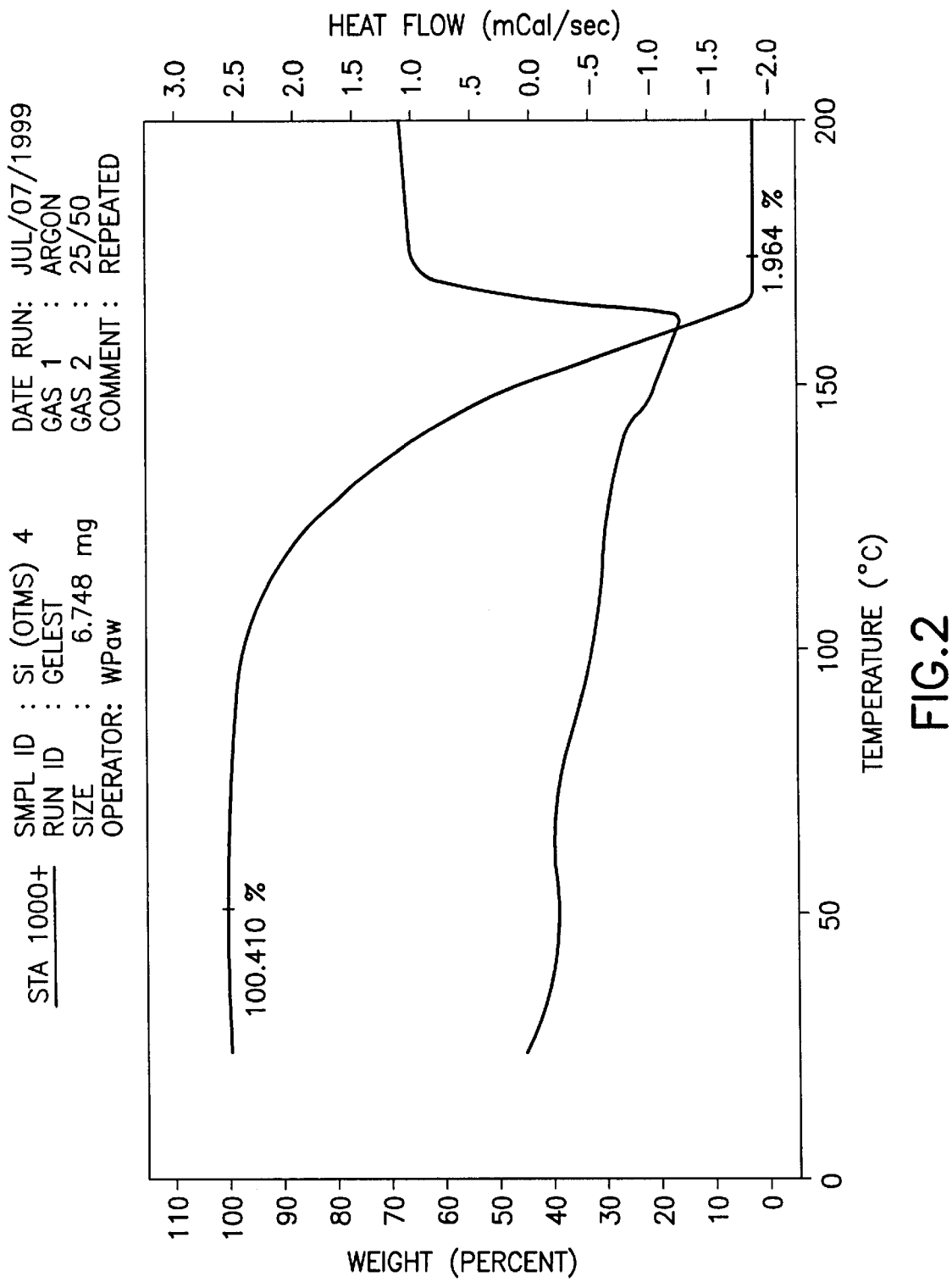
FIG. 2 is an STA plot for $Si(O—SiMe_3)_4$.
Figure 3:
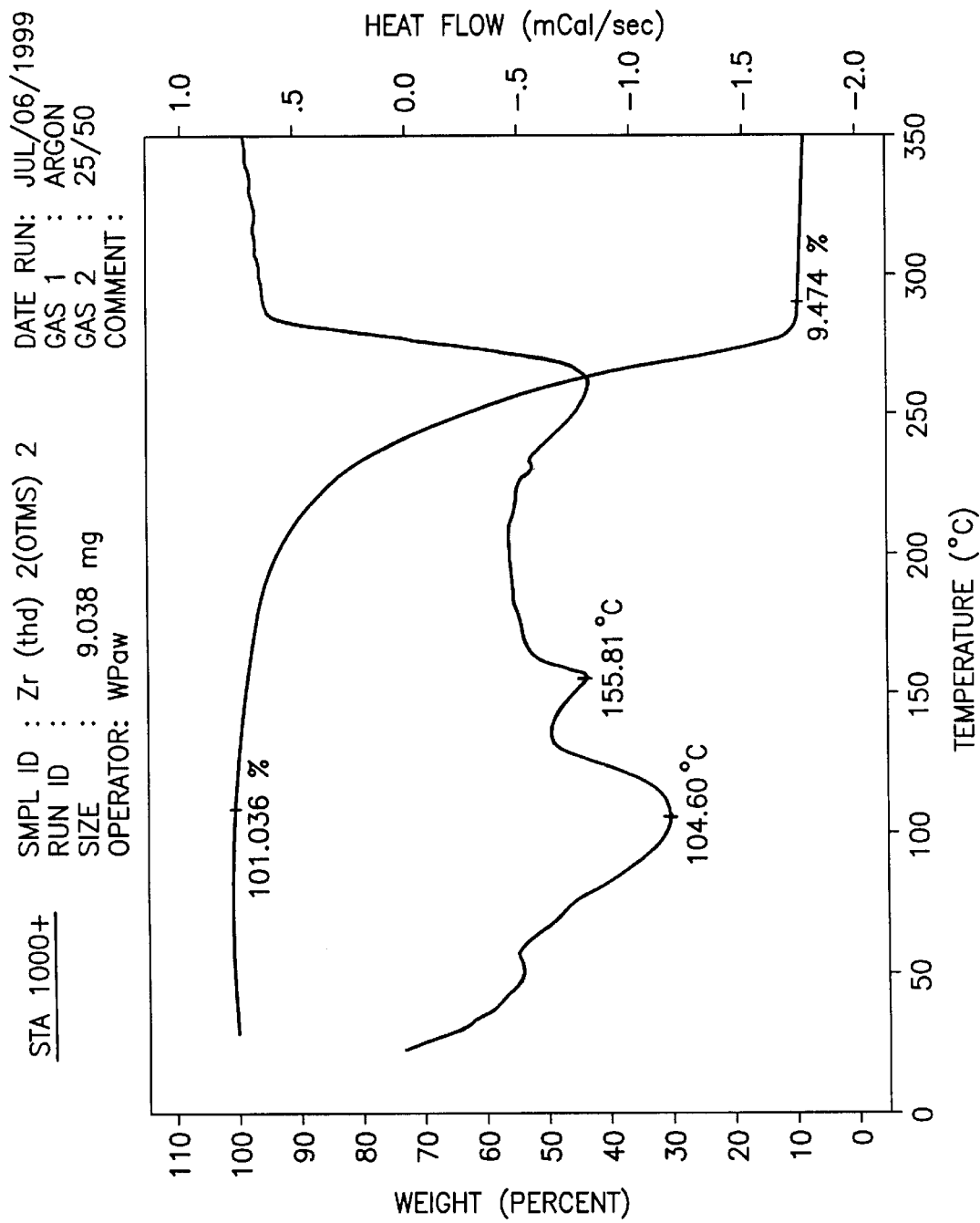
FIG. 3 is an STA plot for $Zr(O—SiMe_3)_2(thd)_2$.
Figure 4:
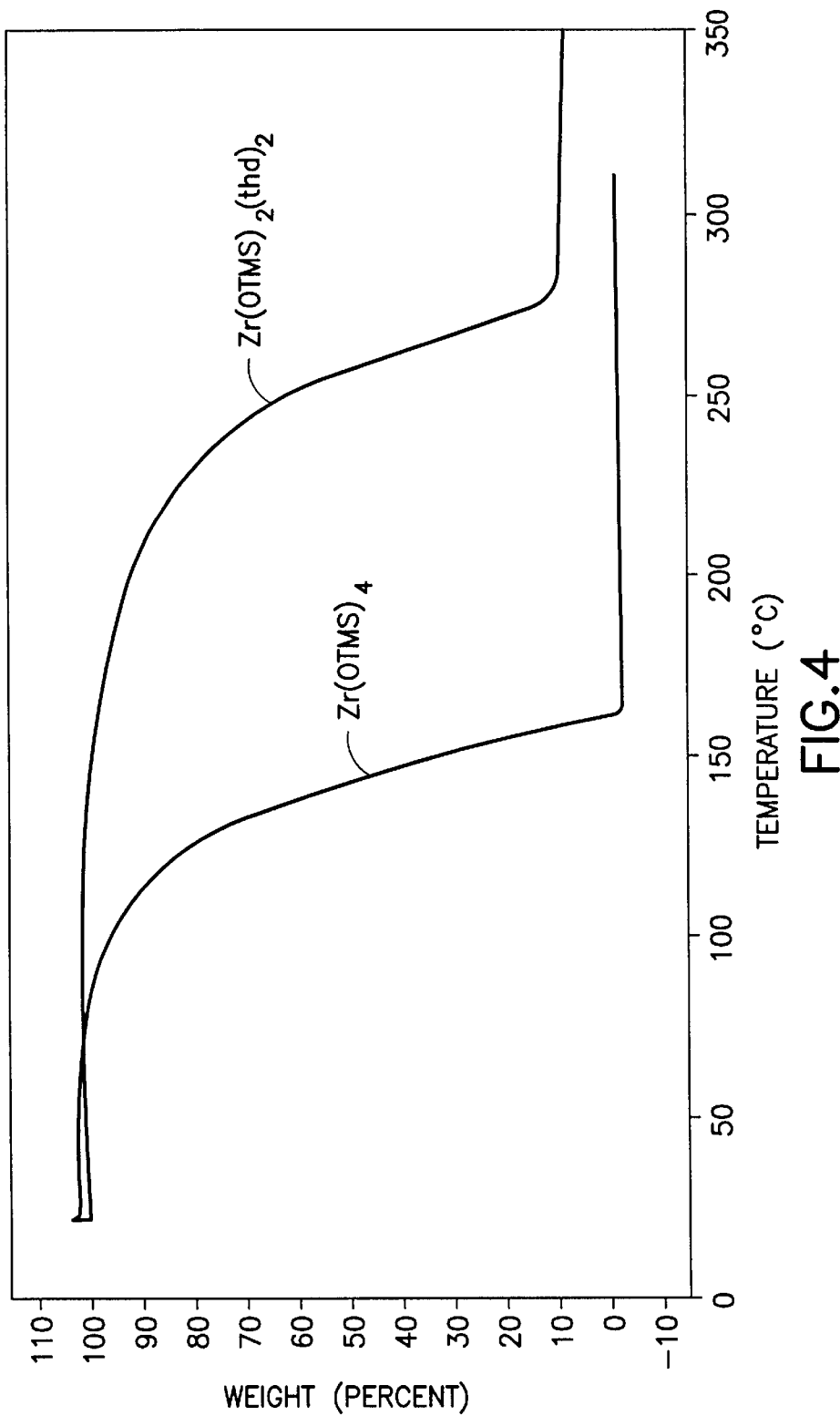
FIG. 4 is an STA plot for $Si(O—SiMe_3)_4$ and $Zr(O—SiMe_3)_2(thd)_2$.
Figure 5:
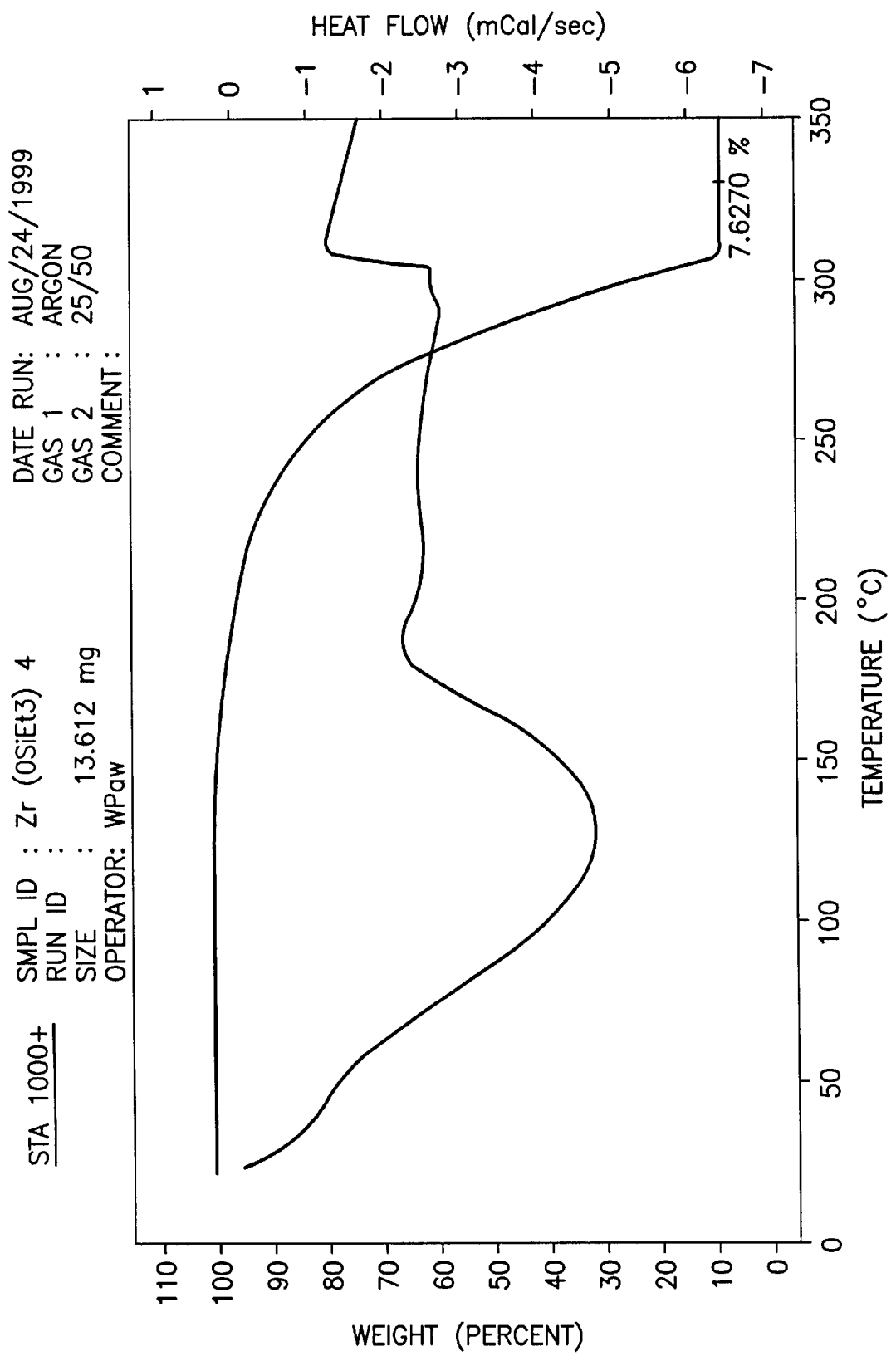
FIG. 5 is an STA plot for $Zr(O—SiEt_3)_4$ single source precursor.

FIGS. 2–5 show the thermal characteristics of illustrative source reagents usefully employed in the practice of the present invention. FIG. 2 is an STA plot for Si(O—SiMe$_3$)$_4$ in argon gas. FIG. 3 is an STA plot for Zr(O—SiMe$_3$)$_2$(thd)$_2$ in argon gas. FIG. 4 is an STA plot for Si(O—SiMe$_3$)$_4$ in argon gas and an STA plot for Zr(O—SiMe$_3$)$_2$(thd)$_2$ in argon gas. FIG. 5 is an STA plot for Zr(O—SiEt$_3$)$_4$ in argon gas.

The features, aspects and advantages of the present invention are further shown with reference to the following non-limiting examples relating to the invention.

EXAMPLE 1

Synthesis of Zr(thd)$_2$(O—SiMe$_3$)$_2$

Standard Schlenk and dry-box techniques were used with nitrogen as the inert gas.

a) Zr(thd)$_2$Cl$_2$. A two-fold excess (four equivalents) of 2,2,6,6-tetramethyl-3,5-heptanedione (Hthd) was added dropwise to the refluxing suspension of ZrCl$_4$ in diethyl ether. The solid gradually dissolved and the reflux was continued for 16 h. The solution was cooled to room temperature, concentrated until Zr(thd)$_2$Cl$_2$ started to precipitate. The precipitate was redissolved in minimum amount of ether; the solution was filtered and placed in the freezer (−20° C.) for 40 hours. The white precipitate that formed, was filtered and dried under nitrogen. Yield: 75–90%.

b) Zr(thd)$_2$(OSiMe$_3$)$_2$. Aliquots of Zr(thd)$_2$Cl$_2$ and LiO-SiMe$_3$ in one to two molar ratio were suspended in pentane and this mixture was stirred for 16 hours. Upon separation of LiCl by filtration, the slightly yellow solution was evaporated to dryness to give $Zr(thd)_2(OSiMe_3)_2$ in ca. 65% yield.

EXAMPLE 2

Synthesis of $Zr(O—SiEt_3)_4$

Standard Schlenk techniques were used with nitrogen as the inert gas. A 10% excess of $HOSiEt_3$ (4.1 equivalents) dissolved in benzene was added dropwise over the period of two hours into a refluxing solution of $Zr(O^iPr)_4$ in benzene at a rate which approximated that of benzene/isopropanol azeotrope distilling from the reaction flask. After the addition was complete, the reflux was continued until all of benzene was distilled out. Excess silanol was removed under 0.2 torr vacuum at temperatures below 100° C. Then, the temperature was raised and the clear liquid product distilled at 147° C./0.1 torr. Yield: 82%.

EXAMPLE 3

An organic solution (octane) comprising zirconium bis(trimethylsiloxide) bis(2,2,7,7-tetramethyl-3,5-heptandionate) was delivered by liquid delivery to a heated vaporization zone and transported into a CVD reactor. The vapor stream was reacted at a substrate heated to elevated temperatures (300–700 C.) in an oxidizing environment to deposit a zirconium silicate gate dielectric thin-film. The ratio of the Zr/Si was controlled by using specific CVD process conditions or via the co-addition of a second non-silicon containing Zr source [i.e., zirconium tetrakis(2,2,7,7-tetramethyl-3,5-heptandionate), zirconium bis(alcoxide) bis(2,2,7,7-tetramethyl-3,5-heptandionate) or zirconium oxo 2,2,7,7-tetramethyl-3,5-heptandionate) dimer] to increase the Zr content in the deposited film or with a non-zirconium containing silicon tetra(alcoxide) to increase the Si content in the deposited film.

EXAMPLE 4

An organic solution (octane) comprising hafnium bis(trimethylsiloxide) bis(2,2,7,7-tetramethyl-3,5-heptandionate) was delivered by liquid delivery to a heated vaporization zone and transported into a CVD reactor. The vapor stream was reacted at a substrate heated to elevated temperatures (300–700 C.) in an oxidizing environment to deposit a hafnium silicate gate dielectric thin-film. The ratio of the Hf/Si was controlled by using specific CVD process conditions or via the co-addition of a second non-silicon containing Hf source [i.e., hafnium tetrakis(2,2,7,7-tetramethyl-3,5-heptandionate), hafnium bis(alcoxide) bis(2,2,7,7-tetramethyl-3,5-heptandionate) or hafnium alcoxide precursor] to increase the Hf content in the deposited film or with a non-hafnium containing silicon tetra(alcoxide) to increase the Si content in the deposited film.

EXAMPLE 5

A neat liquid comprising zirconium tetrakis(triethylsiloxide) was delivered by liquid delivery to a heated vaporization zone and transported into a CVD reactor. The vapor stream was reacted at a substrate heated to elevated temperatures (300–700 C.) in an oxidizing environment to deposit a zirconium silicate gate dielectric thin-film. The ratio of the Zr/Si was controlled by using specific CVD process conditions (temperature, pressure, flows, etc.) or via the co-addition of a second non-silicon containing liquid Zr source [i.e., zirconium tetrakis(2,2,7,7-tetramethyl-3,5-heptandionate), zirconium bis(alcoxide) bis(2,2,7,7-tetramethyl-3,5-heptandionate) or zirconium tetrakis(t-butoxide)] to increase the Zr content in the deposited film or with a non-zirconium containing silicon species, such as silicon tetra(ethoxide) to increase the Si content in the deposited film.

EXAMPLE 6

A neat liquid comprising hafnium tetrakis(triethylsiloxide) was delivered by liquid delivery to a heated vaporization zone and transported into a CVD reactor. The vapor stream was reacted at a substrate heated to elevated temperatures (300–700 C.) in an oxidizing environment to deposit a zirconium silicate gate dielectric thin-film. The ratio of the Hf/Si was controlled by using specific CVD process conditions (temperature, pressure, flows, etc.) or via the co-addition of a second non-silicon containing liquid Hf source [i.e., hafnium tetrakis(2,2,7,7-tetramethyl-3,5-heptandionate), hafnium bis(alcoxide) bis(2,2,7,7-tetramethyl-3,5-heptandionate) or hafnium tetrakis(t-butoxide)] to increase the Hf content in the deposited film or with a non-hafnium containing silicon species, such as silicon tetra(ethoxide) to increase the Si content in the deposited film.

EXAMPLE 7

A neat liquid comprising zirconium tetrakis(trialkylsiloxide) was delivered by liquid delivery to a heated vaporization zone and transported into a CVD reactor. The vapor stream was reacted at a substrate heated to elevated temperatures (300–700 C.) in an oxidizing environment to deposit a zirconium silicate gate dielectric thin-film. The ratio of the Zr/Si was controlled by using specific CVD process conditions (temperature, pressure, flows, etc.) to deposit a film that exhibited similar stoichiometry as that found in the atomic ratios of elements in the precursor source. Thus, a non-stoichiomtric zirconium silicate could be directly deposited from a single source precursor. The deposited film stoichiometry could be altered by the co-addition of a second non-silicon containing liquid Zr source to increase the Zr content in the deposited film or with a non-zirconium containing silicon species to increase the Si content in the deposited film.

EXAMPLE 8

A neat liquid comprising hafnium tetrakis(trialkylsiloxide) was delivered by liquid delivery to a heated vaporization zone and transported into a CVD reactor. The vapor stream was reacted at a substrate heated to elevated temperatures (300–700 C.) in an oxidizing environment to deposit a hafnium silicate gate dielectric thin-film. The ratio of the Hf/Si was controlled by using specific CVD process conditions (temperature, pressure, flows, etc.) to deposit a film that exhibited similar stoichiometry as that found in the atomic ratios of elements in the precursor source. Thus, a non-stoichiometric hafnium silicate could be directly deposited from a single source precursor. The deposited film stoichiometry could be altered by the co-addition of a second non-silicon containing liquid Hf source to increase the Hf content in the deposited film or with a non-hafnium containing silicon species to increase the Si content in the deposited film.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A CVD precursor composition for forming a metal silicate film on a substrate, such precursor composition including a source reagent selected from the group consisting of:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof;

(c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the desired M/Si ratio in the deposited silicate thin film;

(d) a precursor mixture comprising (1) a first precursor metal compound or complex including a metal M, wherein M=Zr or Hf and (2) a second precursor silicon compound or complex not containing such metal M, wherein the second precursor silicon compound or complex is a gas at STP and wherein the relative proportions of the first and second precursors relative to one another are employed to controllably establish the desired Mx/Si1−x ratio in the deposited silicate thin film wherein x is from 0.01 to 0.99;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired Mx/Si1−x ratio in the deposited silicate thin film wherein x is from 0.01 to 0.99;

(f) a precursor metal compound or complex including a metal M, wherein M=Zr or Hf, at least one alcoxide ligand and at least one b-diketonate ligand, such precursor metal compound or complex further containing silicon;

(g) a precursor metal compound or complex including a metal M, wherein M=Zr or Hf, at least one alcoxide ligand and at least one β-diketonate ligand comprising a formula:

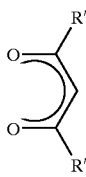

wherein each R' is independently selected from the group consisting of $C_4$–$C_8$ alkyl, halo and $C_1$–$C_8$ haloalkyl, such precursor metal compound or complex optionally further containing silicon;

(h) the precursor metal compound or complex (e) further containing silicon, in combination with a second non-silicon-containing precursor metal compound or complex including a metal M, wherein M=Zr or Hf; and (i) compatible mixtures of any two or more of the foregoing species (a)–(h).

2. The CVD precursor composition of claim 1, further comprising a solvent medium.

3. The CVD precursor composition of claim 2, wherein the solvent is selected from the group consisting of ethers, glymes, tetraglymes, amines, polyamines, alcohols, glycols, aliphatic hydrocarbon solvents, aromatic hydrocarbon solvents, cyclic ethers, and compatible combinations of two or more of the foregoing.

4. The CVD precursor composition of claim 1, comprising a source reagent (a).

5. The CVD precursor composition of claim 1, comprising a source reagent (b).

6. The CVD precursor composition of claim 1, comprising a source reagent (c).

7. The CVD precursor composition of claim 1, comprising a source reagent (d).

8. The CVD precursor composition of claim 1, comprising a source reagent (e).

9. The CVD precursor composition of claim 1, comprising a source reagent (f).

10. The CVD precursor composition of claim 1, comprising a source reagent (g).

11. The CVD precursor composition of claim 1, comprising a source reagent (h).

12. The CVD precursor composition of claim 1, comprising a source reagent (i).

13. The CVD precursor composition of claim 1, comprising a metal β-diketonate source reagent selected from the group consisting of those of the formula:

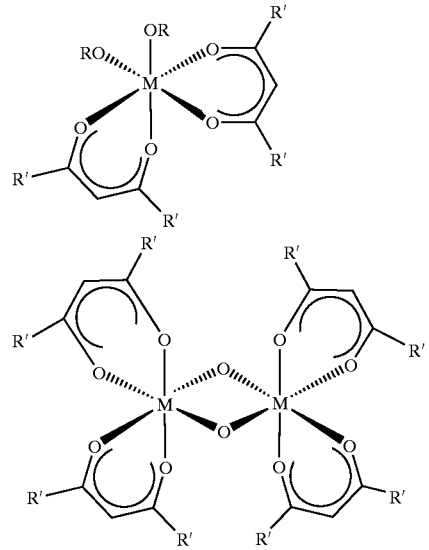

wherein:

M is Zr or Hf;

each R is independently selected from the group consisting of $C_1$–$C_8$ alkyl and trialkylsilyl whose alkyl substituents are each independently selected from the group consisting of $C_1$–$C_8$ alkyl; and each R' is independently selected from the group consisting of $C_1$-$C_8$ alkyl, halo and $C_1$-$C_8$ haloalkyl.

14. The CVD precursor composition of claim 13, wherein M is Zr.

15. The CVD precursor composition of claim 13, wherein M is Hf.

16. The CVD precursor composition of claim 13, wherein the source reagent comprises a β-diketonate moiety selected from the group consisting of acac, tfac, hfac, thd, tod, and fod.

17. The CVD precursor composition of claim 13, wherein each R is t-butyl or trimethylsilyl and each R' is t-butyl.

18. The CVD precursor composition of claim 1, wherein the source reagent comprises a single source compound selected from the group consisting of Zr bis (trimethylsiloxide) bis(thd), tetrakis(trimethylsiloxide) zirconium, tetrakis(trimethylsiloxide) hafnium, and Hf bis (trimethylsiloxide) bis(thd).

19. The CVD precursor composition of claim 1, wherein the source reagent comprises an aliphatic alcoxide of hafnium, and a Si-containing precursor.

20. The CVD precursor composition of claim 19, wherein the Si-containing precursor comprises a silicon alcoxide ligand.

21. The CVD precursor composition of claim 1, wherein the source reagent comprises (1) a first metal- and silicon-containing precursor, and (2) a metal-containing/silicon-free precursor or a metal-free/silicon-containing precursor.

22. The CVD precursor composition of claim 1, wherein the source reagent comprises tetrakis(trimethylsiloxide) zirconium and tetrakis(t-butoxide) zirconium.

23. The CVD precursor composition of claim 22, further comprising octane.

24. The CVD precursor composition of claim 1, wherein the source reagent comprises tetrakis(trimethylsiloxide) hafnium and tetrakis(t-butoxide) hafnium.

25. The CVD precursor composition of claim 1, comprising a first source reagent containing silicon and a second source reagent containing Zr or Hf, wherein the first and second source reagents contain compatible ligands which do not undergo ligand exchange reaction under precursor vaporization and deposition conditions.

26. The CVD precursor composition of claim 1, comprising a first source reagent containing silicon, a second source reagent containing Zr or Hf, and a solvent, wherein the first and second source reagents contain compatible ligands which do not undergo ligand exchange reaction under precursor vaporization and deposition conditions.

27. The CVD precursor composition of claim 1, wherein the source reagent comprises tetrakis(t-butoxy) zirconium and tetrakis(t-butoxy) silane.

28. The CVD precursor composition of claim 1, wherein the source reagent comprises alcoxides of Zr and/or Hf and alcoxides of Si, wherein the same alcoxide ligand species selected from the group consisting of methoxides, ethoxides, i-propoxides, t-butoxides, and trialkylsiloxides, are present in each of the alcoxides of Zr and/or Hf and alcoxides of Si.

29. The CVD precursor composition of claim 1, wherein the source reagent comprises metal alcoxide β-diketonate mixtures in which one of the metal alcoxide β-diketonate precursors contains silicon, and a second of the metal alcoxide β-diketonate precursors does not contain silicon.

30. The CVD precursor composition of claim 1, wherein the source reagent comprises a mixture of Zr(O—SiMe$_3$)$_2$(thd)$_2$ and a silicon-free precursor selected from the group consisting of bis(alcoxide) bis(thd) zirconium, tetrakis(thd) zirconium and oxo zirconium bis(thd) dimer.

31. The CVD precursor composition of claim 1, wherein the source reagent comprises Zr(O—SiMe$_3$)$_2$(thd)$_2$ and Zr(thd)$_4$.

32. The CVD precursor composition of claim 1, wherein the source reagent comprises Zr(O—SiMe$_3$)$_2$(thd)$_2$ and [O=Zr(thd)$_2$].

33. The CVD precursor composition of claim 1, comprising a source reagent selected from the group consisting of those of the formulae:

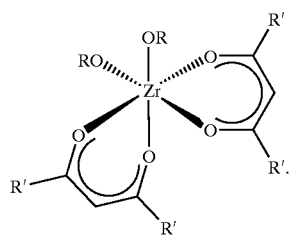

I

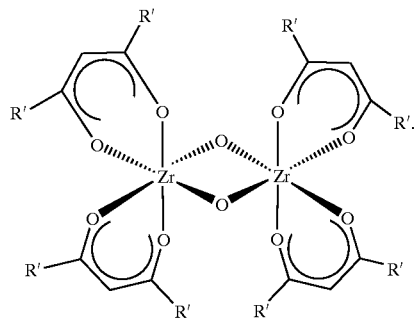

II wherein R is t-butyl or trimethylsilyl and R' is t-butyl.

34. The CVD precursor composition of claim 1, comprising a source reagent selected from the group consisting of those of the formulae:

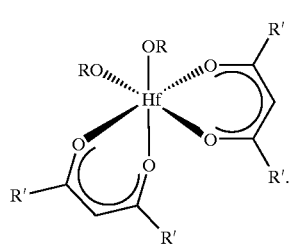

III

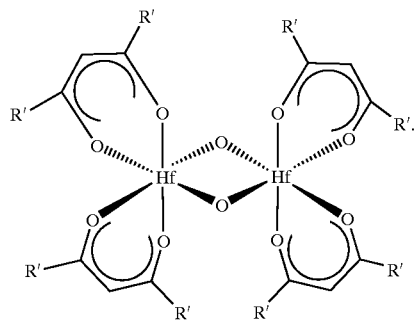

IV wherein each R is independently selected from the group consisting of methyl, ethyl, i-propyl, n-butyl and trimethylsilyl, and each R' is independently selected from the group consisting of alkyl, halo, and haloalkyl wherein the alkyl substituent is selected from the group consisting of methyl, ethyl, i-propyl, and n-butyl.

35. A method of forming a metal silicate gate dielectric film on a substrate, comprising vaporizing a precursor composition to form a precursor vapor, and contacting the precursor vapor with a substrate at elevated temperature to deposit the metal silicate gate dielectric film on the substrate, wherein the precursor composition includes a source reagent selected from the group consisting of:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof;

(c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the desired $M_x/Si_{1-x}$ ratio in the deposited silicate thin film wherein x is from 0.01 to 0.99;

(d) a precursor mixture comprising (1) a first precursor metal compound or complex including a metal M, wherein M=Zr or Hf and (2) a second precursor silicon compound or complex not containing such metal M, wherein the relative proportions of the first and second precursors relative to one another are employed to controllably establish the $M_x/Si_{1-x}$ ratio in the deposited silicate thin film wherein x is from 0.01 to 0.99;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired $M_x/S_{1-x}$ ratio in the deposited silicate thin film wherein x is from 0.01 to 0.99;

(f) a precursor metal compound or complex including a metal M, wherein M=Zr or Hf, at least one alcoxide ligand and at least one β-diketonate ligand, such precursor metal compound or complex optionally further containing silicon;

(g) the precursor metal compound or complex (d) wherein the second precursor silicon compound or complex not containing such metal M is a gas at STP and the relative proportions of the first and second precursors relative to one another are employed to controllably establish the desired $M_x/Si_{1-x}$ ratio in the deposited silicate thin film wherein x is from 0.01 to 0.99;

(h) the precursor metal compound or complex (e) not containing silicon, in combination with a second silicon-containing precursor compound or complex;

(i) the precursor metal compound or complex (e) further containing silicon, in combination with a second non-silicon-containing precursor metal compound or complex including a metal M, wherein M=Zr or Hf; and (j) compatible mixtures of any two or more of the foregoing species (a)–(i).

36. The method of claim 35, wherein the precursor composition further comprises a solvent medium.

37. The method of claim 36, wherein the solvent medium comprises a solvent selected from the group consisting of ethers, glymes, tetraglymes, amines, polyamines, alcohols, glycols, aliphatic hydrocarbon solvents, aromatic hydrocarbon solvents, cyclic ethers, and compatible combinations of two or more of the foregoing.

38. The method of claim 35, wherein the precursor composition comprises a source reagent (a).

39. The method of claim 35, wherein the precursor composition comprises a source reagent (b).

40. The method of claim 35, wherein the precursor composition comprises a source reagent (c).

41. The method of claim 35, wherein the precursor composition comprises a source reagent (d).

42. The method of claim 35, wherein the precursor composition comprises a source reagent (e).

43. The method of claim 35, wherein the precursor composition comprises a source reagent (f).

44. The method of claim 35, wherein the precursor composition comprises a source reagent (g).

45. The method of claim 35, wherein the precursor composition comprises a source reagent (h).

46. The method of claim 35, wherein the precursor composition comprises a source reagent (i).

47. The method of claim 35, wherein the precursor composition comprises a source reagent (i).

48. The method of claim 35, wherein the precursor composition comprises a source reagent (j).

49. The method of claim 35, wherein the precursor composition comprises a metal alcoxide β-diketonate source reagent selected from the group consisting of those of the formula:

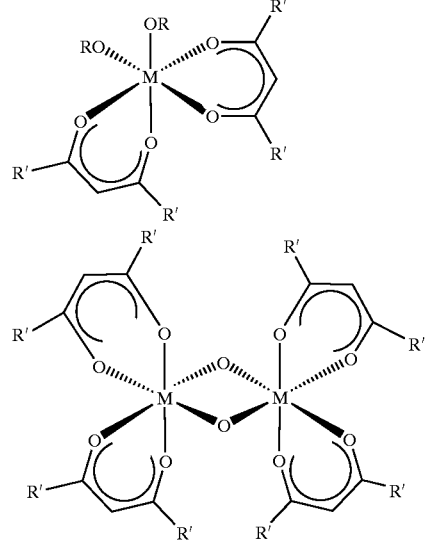

wherein:

M is Zr or Hf;

each R is independently selected from the group consisting of $C_1$–$C_8$ alkyl and trialkylsilyl whose alkyl substituents are each independently selected from the group consisting of $C_1$–$C_8$ alkyl; and each R' is independently selected from the group consisting of $C_1$–$C_8$ alkyl, halo and $C_1$–$C_8$ haloalkyl.

50. The method of claim 49, wherein M is Zr.

51. The method of claim 49, wherein M is Hf.

52. The method of claim 49, wherein the source reagent comprises a β-diketonate moiety selected from the group consisting of acac, tfac, hfac, thd, tod, and fod.

53. The method of claim 49, wherein each R is t-butyl or trimethylsilyl and each R' is t-butyl.

54. The method of claim 35, wherein the precursor composition comprises a single source compound selected from the group consisting of Zr(OSiMe$_3$)$_2$(thd)$_2$, Zr(OSiMe$_3$)$_4$, Hf(OSiMe$_3$)$_4$, and Hf(OSiMe$_3$)$_2$(thd)$_2$.

55. The method of claim 35, wherein the precursor composition comprises an aliphatic alcoxide of hafnium, and a Si-containing precursor.

56. The method of claim 55, wherein the Si-containing precursor comprises a silicon alcoxide ligand.

57. The method of claim 35, wherein the precursor composition comprises (1) a first metal- and silicon-containing precursor, and (2) a metal-containing/silicon-free precursor or a metal-free/silicon-containing precursor.

58. The method of claim 35, wherein the precursor composition comprises Zr(OSiMe$_3$)$_4$ and Zr(OtBU)$_4$.

59. The method of claim 58, further comprising octane.

60. The method of claim 35, wherein the precursor composition comprises Hf(OSiMe$_3$)$_4$ and Hf(O-tBu)$_4$.

61. The method of claim 35, wherein the precursor composition comprises a first source reagent containing silicon and a second source reagent containing Zr or Hf; wherein the first and second source reagents contain compatible ligands which do not undergo ligand exchange reaction under precursor vaporization and deposition conditions.

62. The method of claim 35, wherein the precursor composition comprises Zr(O-tBu)$_4$ and Si(O-tBu)$_4$.

63. The method of claim 35, wherein the precursor composition comprises alcoxides of Zr and/or Hf and alcoxides of Si, wherein the same alcoxide ligand species selected from the group consisting of methoxides, ethoxides, i-propoxides, t-butoxides, and trialkylsiloxides, are present in each of the alcoxides of Zr and/or Hf and alcoxides of Si.

64. The method of claim 35, wherein the precursor composition comprises metal alcoxide β-diketonate mixtures in which one of the metal alcoxide β-diketonate precursors contains silicon, and a second of the metal alcoxide β-diketonate precursors does not contain silicon.

65. The method of claim 35, wherein the precursor composition comprises a mixture of Zr(OSiMe$_3$)$_2$(thd)$_2$, and a silicon-free precursor selected from the group consisting of Zr(alcoxide)$_2$(thd)$_2$, and Zr(thd)$_4$.

66. The method of claim 35, wherein the precursor composition comprises Zr(O—SiMe$_3$)$_2$(thd)$_2$ and Zr(thd)$_4$.

67. The method of claim 35, wherein the precursor composition comprises a source reagent selected from the group consisting of those of the formulae:

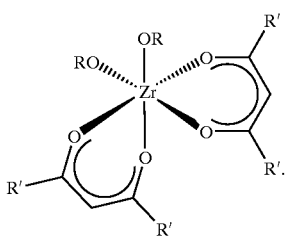

I

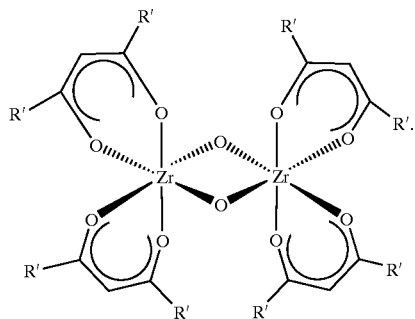

II wherein R is t-butyl or trimethylsilyl and R' is t-butyl.

68. The method of claim 35, wherein the precursor composition comprises a source reagent selected from the group consisting of those of the formulae:

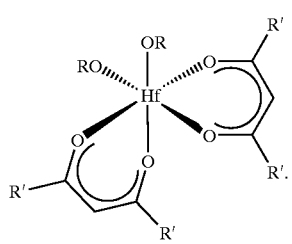

III

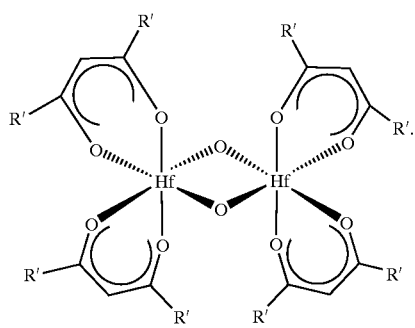

IV wherein each R is independently selected from the group consisting of methyl, ethyl, i-propyl, n-butyl and trimethylsilyl, and each R' is independently selected from the group consisting of alkyl, halo, and haloalkyl wherein the alkyl substituent is selected from the group consisting of methyl, ethyl, i-propyl, and n-butyl.

69. The method of claim 35, wherein the precursor composition comprises incompatible metal and silicon precursors, and the step of contacting the precursor vapor with a substrate at elevated temperature to deposit on the substrate the metal silicate gate dielectric film comprises pulsed chemical vapor deposition, in which the incompatible precursors are separated both temporally and spatially to limit particle formation and undesired ligand exchange reactions.

70. A CVD precursor vapor composition for forming a metal silicate film on a substrate, such precursor vapor composition including a source reagent selected from the group consisting of:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof, (c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the desired Mx/Si1−x ratio in the deposited silicate thin film wherein x is from 0.01 to 0.99;

(d) a precursor mixture comprising (1) a first precursor metal compound or complex including a metal M, wherein M=Zr or Hf and (2) a second precursor silicon compound or complex not containing such metal M, wherein the relative proportions of the first and second precursors relative to one another are employed to controllably establish the desired Mx/Si1−x ratio in the deposited silicate thin film wherein x is from 0.01 to 0.99;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired Mx/Si1−x ratio in the deposited silicate thin film wherein x is from 0.01 to 0.99;

(f) a precursor metal compound or complex including a metal M, wherein M=Zr or Hf, at least one alcoxide ligand and at least one β-diketonate ligand, such precursor metal compound or complex optionally farther containing silicon;

(g) the precursor metal compound or complex (d) wherein the second precursor silicon compound or complex not containing such metal M is a gas at STP and the relative proportions of the first and second precursors relative to one another are employed to controllably establish the desired Mx/Si1−x ratio in the deposited silicate thin film wherein x is from 0.01 to 0.99;

(h) the precursor metal compound or complex (e) not containing silicon, in combination with a second silicon-containing precursor compound or complex;

(i) the precursor metal compound or complex (e) further containing silicon, in combination with a second non-silicon-containing precursor metal compound or complex including a metal M, wherein M=Zr or Hf; and (j) compatible mixtures of any two or more of the foregoing species (a)–(i).

71. A metal silicate thin film deposited on a substrate via CVD from a precursor composition including a source reagent selected from the group consisting of:

(a) single source precursors for forming zirconium silicate thin films, wherein the precursor is a compound or coordinated complex containing Zr, O and Si as constituents thereof;

(b) single source precursors for forming hafnium silicate thin films, wherein the precursor is a compound or coordinated complex containing Hf, O and Si as constituents thereof;

(c) a precursor mixture comprising (1) a first precursor metal compound or complex including a silicon alcoxide (siloxide) ligand coordinated to a metal M, wherein M=Zr or Hf and (2) a second precursor metal compound or complex including an aliphatic alcoxide ligand coordinated to a metal M, wherein M=Zr or Hf, wherein the relative proportions of the first and second precursors relative to one another are employed to controllably establish the desired M/Si $M_x/Si_{1-x}$ ratio in the deposited silicate thin film wherein x is from 0.01 to 0.99;

(d) a precursor mixture comprising (1) a first precursor metal compound or complex including a metal M, wherein M=Zr or Hf and (2) a second precursor silicon compound or complex not containing such metal M, wherein the relative proportions of the first and second precursors relative to one another are employed to controllably establish the desired M/Si $M_x/Si_{1-x}$ ratio in the deposited silicate thin film wherein x is from 0.01 to 0.99;

(e) a precursor mixture comprising (1) a first precursor metal compound or complex including a metal M, wherein M=Zr or Hf and (2) a second precursor silicon compound or complex additionally containing such metal M, wherein the relative proportions of the first and second precursors relative to one another are employed to controllably establish the desired M/Si $M_x/Si_{1-x}$ ratio in the deposited silicate thin film wherein x is from 0.01 to 0.99;

(f) a precursor metal compound or complex including a metal M, wherein M=Zr or Hf, at least one alcoxide ligand and at least one β-diketonate ligand, such precursor metal compound or complex optionally further containing silicon;

(g) the precursor metal compound or complex (d) wherein the second precursor silicon compound or complex not containing such metal M is a gas at STP and the relative proportions of the first and second precursors relative to one another are employed to controllably establish the desired $M_x/Si_{1-x}$ ratio in the deposited silicate thin film wherein x is from 0.01 to 0.99;

(h) the precursor metal compound or complex (e) not containing silicon, in combination with a second silicon-containing precursor compound or complex;

(i) the precursor metal compound or complex (e) further containing silicon, in combination with a second non-silicon-containing precursor metal compound or complex including a metal M, wherein M=Zr or Hf; and (j) compatible mixtures of any two or more of the foregoing species (a)–(i).

* * * * *

UNITED STATES PATENT AND TRADEMARK OFFICE
CERTIFICATE OF CORRECTION

PATENT NO. : 6,399,208 B1
DATED : June 4, 2002
INVENTOR(S) : Tom Baum et al.

It is certified that error appears in the above-identified patent and that said Letters Patent is hereby corrected as shown below:

<u>Column 6,</u>
Line 64, delete "1,1,1-trifuoro-2,4pentanedionato tfac" and substitute -- 1,1,1-trifluoro-2,4-pentandionate tfac --.

Signed and Sealed this

Eleventh Day of February, 2003

JAMES E. ROGAN
*Director of the United States Patent and Trademark Office*